(12) United States Patent
Lee

(10) Patent No.: US 7,184,279 B2
(45) Date of Patent: Feb. 27, 2007

(54) SOLID STATE SWITCHING CIRCUIT

(75) Inventor: Thomas G. Lee, Madison, CT (US)

(73) Assignee: Thermatool Corp., East Haven, CT (US)

( * ) Notice: Subject to any disclaimer, the term of this patent is extended or adjusted under 35 U.S.C. 154(b) by 195 days.

(21) Appl. No.: 11/097,525

(22) Filed: Apr. 1, 2005

(65) Prior Publication Data

US 2006/0221651 A1    Oct. 5, 2006

(51) Int. Cl.
H02M 9/02 (2006.01)
H02M 5/10 (2006.01)
H02M 7/523 (2006.01)

(52) U.S. Cl. .............. 363/21.02; 363/21.16; 363/21.09; 363/21.08; 363/16; 363/20; 363/56.12

(58) Field of Classification Search ............ 363/21.02, 363/21.16, 21, 21.09, 21.08, 16, 20, 56.12
See application file for complete search history.

(56) References Cited

U.S. PATENT DOCUMENTS

| 4,415,959 | A | * | 11/1983 | Vinciarelli | 363/21.04 |
| 5,418,709 | A | * | 5/1995 | Lukemire | 323/222 |
| 6,249,444 | B1 | * | 6/2001 | Cross | 363/21.03 |
| 6,317,341 | B1 | * | 11/2001 | Fraidlin et al. | 363/56.09 |
| 6,717,827 | B2 | * | 4/2004 | Ota | 363/21.12 |
| 6,798,672 | B2 | * | 9/2004 | Jinno | 363/20 |
| 6,917,527 | B2 | * | 7/2005 | Takada | 363/16 |
| 2004/0070994 | A1 | * | 4/2004 | Takagi et al. | 363/16 |
| 2006/0092676 | A1 | * | 5/2006 | Liptak et al. | 363/56.02 |

* cited by examiner

Primary Examiner—Michael B. Cleveland
Assistant Examiner—Nguyen Tran
(74) Attorney, Agent, or Firm—Philip O. Post

(57) ABSTRACT

A solid state switching circuit utilizes a transformer in series with the circuit's switching device by which energy initially stored in the primary of the transformer is recovered in resonant circuitry connected to the secondary of the transformer for transfer of the energy to the load when the switching device is not conducting.

4 Claims, 3 Drawing Sheets

SOLID STATE SWITCHING CIRCUIT

CROSS REFERENCE TO RELATED APPLICATIONS

Not applicable.

FIELD OF THE INVENTION

The present invention relates to a solid state switching circuit that has relatively low switching circuit losses and reduced turn-on/turn-off stressing of the solid state switching device and associated freewheeling diode.

BACKGROUND OF THE INVENTION

There are three generally accepted methods for reducing switching losses associated with a solid state switching device: (1) use of resonant mode switching; (2) use of an active snubber circuit; and (3) use of an inductor in series with the switching device and a snubber capacitor in parallel with the switching device.

Resonant mode switching turns on the switching device for a fixed amount of time. Output power is controlled by varying the operating frequency of the switching device. However, varying the operating frequency is more likely to excite some parasitic power circuit oscillations. Also, varying the frequency makes filtering out ripple voltage or ripple current more difficult.

Use of an active snubber circuit which includes additional power components, heat sinks and control circuitry, increases cost and complexity of the switching circuit.

FIG. 1 illustrates a typical step down switch mode (buck chopper) power supply 101, utilizing a switching circuit with switching device SW and series inductor L10. Switching device SW can be any suitable solid state switching device, such as a bipolar transistor, insulated gate bipolar transistor (IGBT) or field-effect transistor. Terminals 1 and 2 are connected to the output of a suitable dc power source (not illustrated in the figure). Capacitor C10 serves as an ac ripple filter for the output voltage of the dc source. Freewheeling diode D10 which is selected from a class of diodes commonly known as fast recovery diodes, provides current flow to series inductor L20 when device SW is turned off. Diode $D_S$, resistor $R_S$ and capacitor $C_S$ form a snubber circuit that carries current when device SW initially turns off. Load $R_L$ is connected to terminals 4 and 5. Use of series inductor L10 reduces stress on switching device SW by preventing simultaneous high voltage and high current during the critical turn-on time of the switching device. Additionally the series inductor reduces stress on freewheeling diode D10 by controlling the rate of change of the reverse current when the diode transitions from forward bias to reverse bias and stops conducting current. However, the series inductor has negative effects when switching device SW turns off. Series inductor L10 causes a high voltage to appear across switching device SW during turn-off. Inductor L10 also reduces the rate of change of current in freewheeling diode D10 after the switching device turns off. This results in diode D10 not carrying the full current immediately after switching device SW turns off. Because inductor L20 forces current to flow, some current path must be provided. Generally, a second diode D20 in series with resistor R20 is required to provide a parallel path for the current while current ramps up in D10 for a relatively long time period of 8 to 10 microseconds (μs). The problems associated with the use of a series inductor can be overcome at the expense of relatively high switching losses and additional circuitry.

Therefore, there is the need for a solid state switching circuit that utilizes an inductive impedance in series with the switching device and freewheeling diode that has low switching circuit losses.

SUMMARY OF THE INVENTION

In one aspect, the present invention is apparatus for and a method of providing a solid state switching circuit that uses the primary of a transformer in series with a switching device to achieve the benefits of a conventional series inductor and, additionally, to recover energy initially stored in the primary of the transformer by means of a resonant circuit connected to the secondary of the transformer.

In another aspect, the present invention is apparatus for and a method of providing a solid state switching circuit with a switching device and fast recovery diode operating within its reverse di/dt rated value without significant derating of the switching device and fast recovery diode.

Other aspects of the invention are set forth in this specification and the appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

Figure 2:
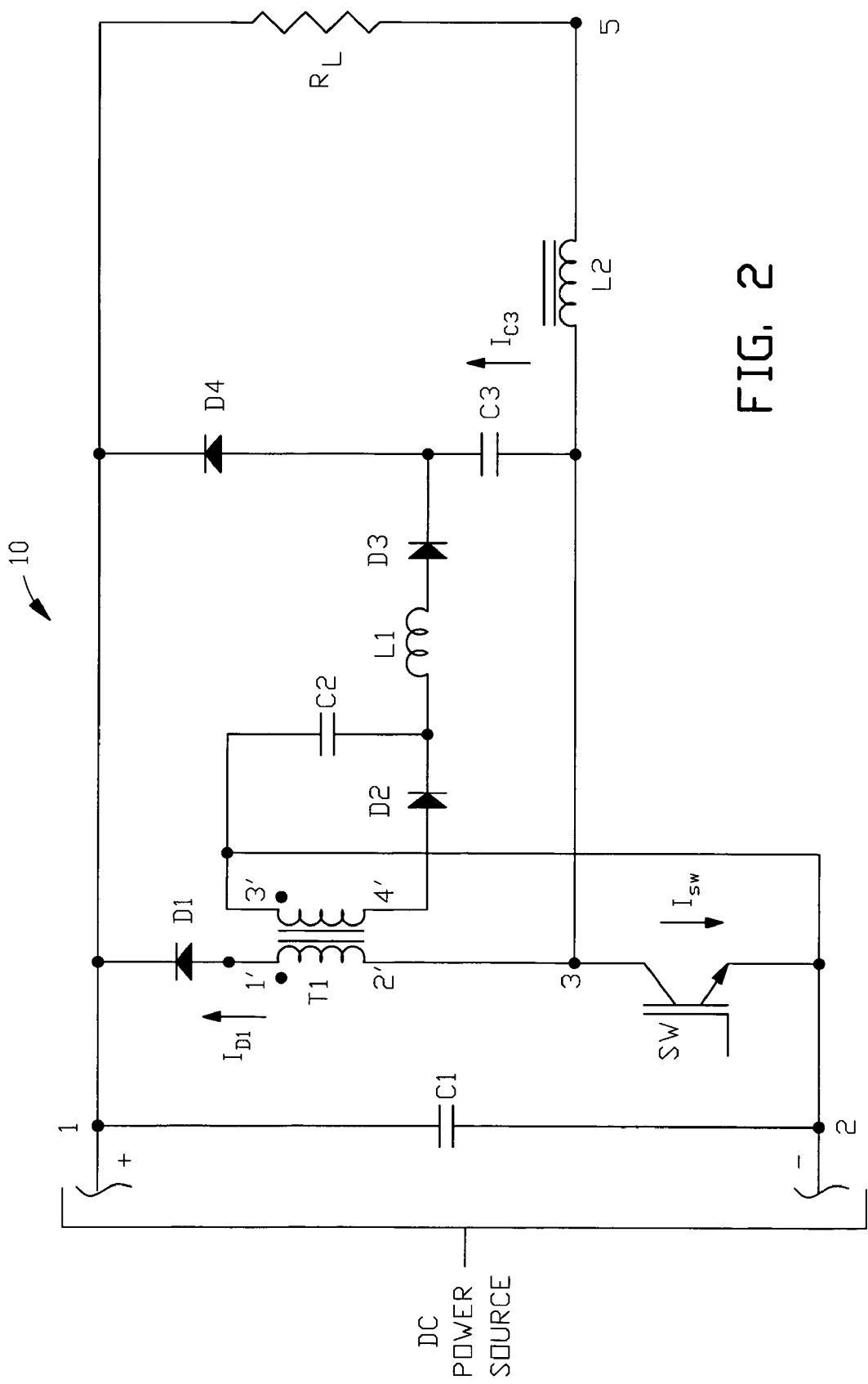
FIG. 2 is a schematic diagram of one example of the solid state switching circuit of the present invention.

Referring to the drawings, wherein like numerals indicate like elements, there is shown in FIG. 2 an illustration of one example of solid state switching circuit 10 of the present invention. Terminals 1 and 2 are representative of connection points to the positive and negative output terminals, respectively, of a dc power source (not illustrated in the figure). By way of example, the dc source may be an ac-to-dc bridge rectifier. Optional capacitor C1 serves as an ac ripple filter for the output voltage from the dc power source.

In this example, which is exemplary and not a limitation of the scope of present invention, solid state switching device SW forms a series circuit with the primary of transformer T1 and freewheeling diode D1. Dots adjacent to the primary and secondary windings of transformer T1 indicate positive polarities of the windings. Device SW can be any solid state switching device, such as a bipolar transistor, insulated gate bipolar transistor (IGBT) or field-effect transistor, that is suitable for a particular application. A suitable gate circuit (not shown in the figure), as appropriate for the selected switching device and known in the art, is provided for switching device SW. The gate circuitry controls the turn on and/or turn off of the switching device. The circuit comprising the series combination of the freewheeling diode, the primary winding of the transformer and the switching device is connected across terminals 1 and 2. Load $R_L$ is connected to terminals 1 and 5 as shown in FIG. 2. Although diagrammatically shown as a resistive load, loads with other impedance characteristics can be used. Load $R_L$ is connected in series with choke L2, which provides a continuous flow of load current. The circuit comprising the series combination of the load impedance and the choke is connected across terminals 1 and 3 as shown in FIG. 2.

Figure 3:
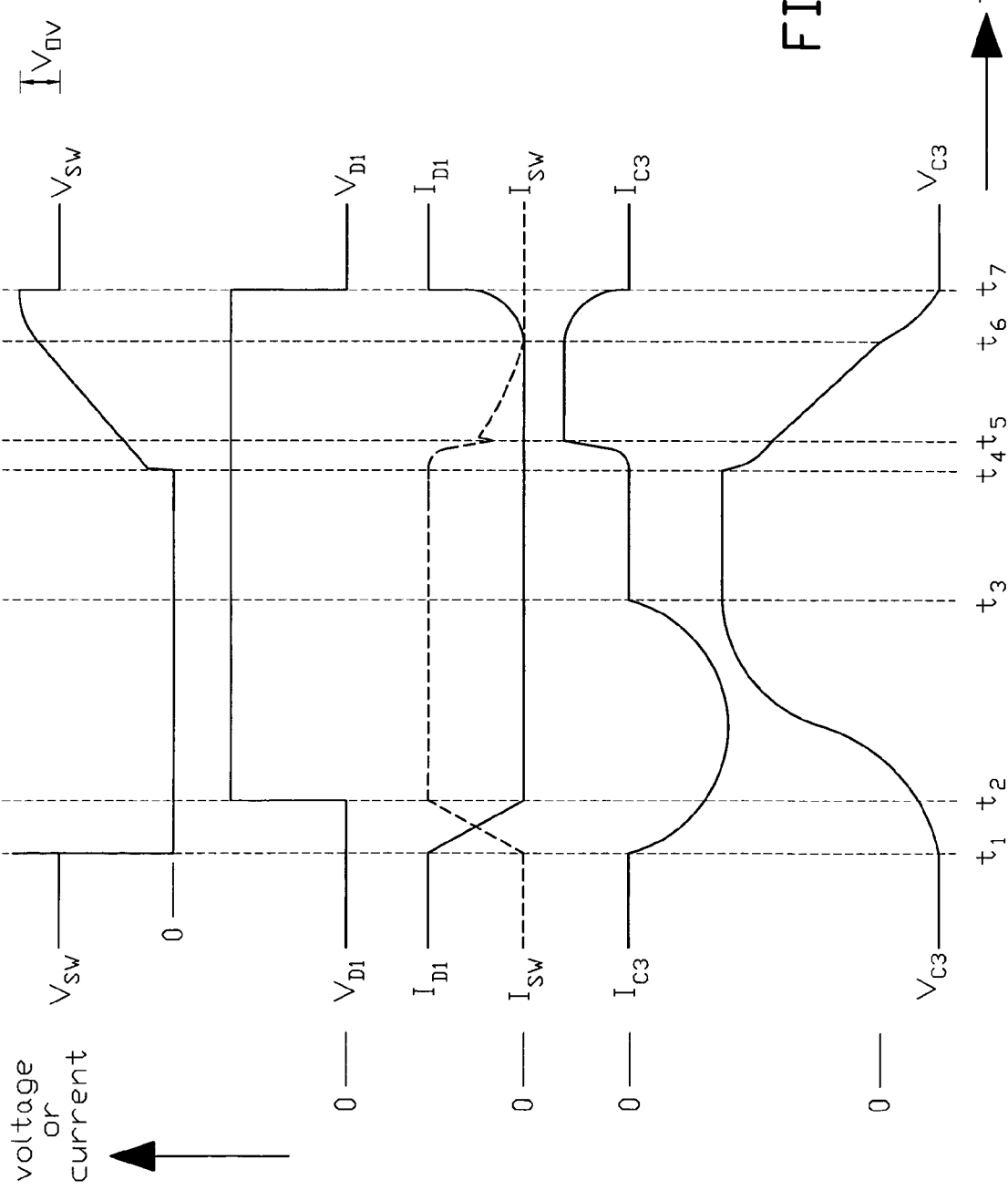
FIG. 3 is a diagram of exemplary waveforms during turn on and turn off of the switching device utilized in one example of the solid state switching circuit of the present invention.

FIG. 3 illustrates various voltage and current magnitudes over time for the circuit shown in FIG. 2 while switching device SW transitions from turn on to a conducting state to turn off to a non-conducting state. Before switching device SW turns on, current is flowing in the circuit path formed by load $R_L$, choke L2, the primary of transformer T1, and diode D1. When device SW is initially gated to turn on to a conducting state as illustrated at time $t_1$ in FIG. 3, bus voltage (across terminals 1 and 2) appears across the primary of transformer T1 and current $I_{D1}$, through the primary of transformer T1 and diode D1, begins to decrease. Because current is relatively constant in choke L2, the drop in current $I_{D1}$ results in an increase of current $I_{SW}$ flowing through switching device SW. Current $I_{D1}$ ramps down at a rate approximately equal to the bus voltage divided by the inductance of transformer T1. For one illustrative example of the invention used herein, with a bus voltage of 600 volts dc and a transformer inductance of 2.0 µH, the rate of change of current $I_{D1}$ will be negative 300 amperes per microsecond. Decreasing current $I_{D1}$ through the primary of transformer T1 and diode D1 passes through zero current to reverse current (not illustrated in FIG. 3) through diode D1 until the diode recovers at time $t_2$ to its relatively small reverse leakage current. At that time, diode D1 begins to block current and support a voltage across its terminals, and device SW carries full load current $I_{SW}$. From time $t_1$ to time $t_2$ neither switching device SW nor diode D1 has a high voltage across its terminals. Only the primary of transformer T1 is subject to a high voltage.

Turn off of switching device SW is initiated at time $t_4$, with transition to a non-conducting state by time $t_6$. The current that switching device SW was carrying is diverted through capacitor C3 and diode D4 to the load impedance, and is designated as current $I_{C3}$ in FIG. 2 and FIG. 3. Charging of capacitor C3 is described below. The voltage increases across non-conducting device SW until ($t_7$ in FIG. 3) the primary of transformer T1 becomes biased such that primary transformer terminal 2' is at a higher voltage than primary transformer terminal 1'. When the primary of the transformer becomes so biased, current begins to flow in the transformer's secondary and through diode D2 and capacitor C2. At operating switching frequency, the secondary of transformer T1 is effectively short-circuited by capacitor C2. Diode D1 is connected in series with an inductive impedance equal to the leakage inductance of transformer T1. For the present example, the impedance of the primary winding of transformer T1 is now less then 0.1 µH. The typically close coupling between the primary and secondary of the transformer limits the magnitude of voltage across device SW to the sum of the bus voltage (between terminals 1 and 2) and the voltage across capacitor C2, multiplied by the turns ratio of transformer T1. Freewheeling diode D1 is quickly driven to forward biased conduction. Because the primary winding's inductance has decreased by more than a factor of 20 in this particular example, current $I_{D1}$ ramps up to a maximum value in 1/20 the time. For the present example, with a maximum switch device current $I_{SW}$ of 1,000 amperes, switch device over-voltage, $V_{ov}$, of 250 volts, and a primary winding inductance, L, of 0.1 µH, the time, ΔT ($t_7$-$t_4$ in FIG. 3), for diode D1 to reach full conduction can be calculated from the following equation:

$V_{ov} = L \cdot [\Delta I_{SW}/\Delta T]$; substituting selected values, $250\ V = [0.1 \times 10^{-6}\ H] \cdot [(1000\ A - 0)/\Delta T$; resulting in $\Delta T = 0.4\ \mu s$.

The above calculation is simplified since the actual voltage across the primary winding of transformer T1 would be in the shape of a quarter-cycle sine wave having a positive offset voltage. Actual time for the present example would be less than 0.44 µs which is approximately equal to the above calculated value.

Figure 1:
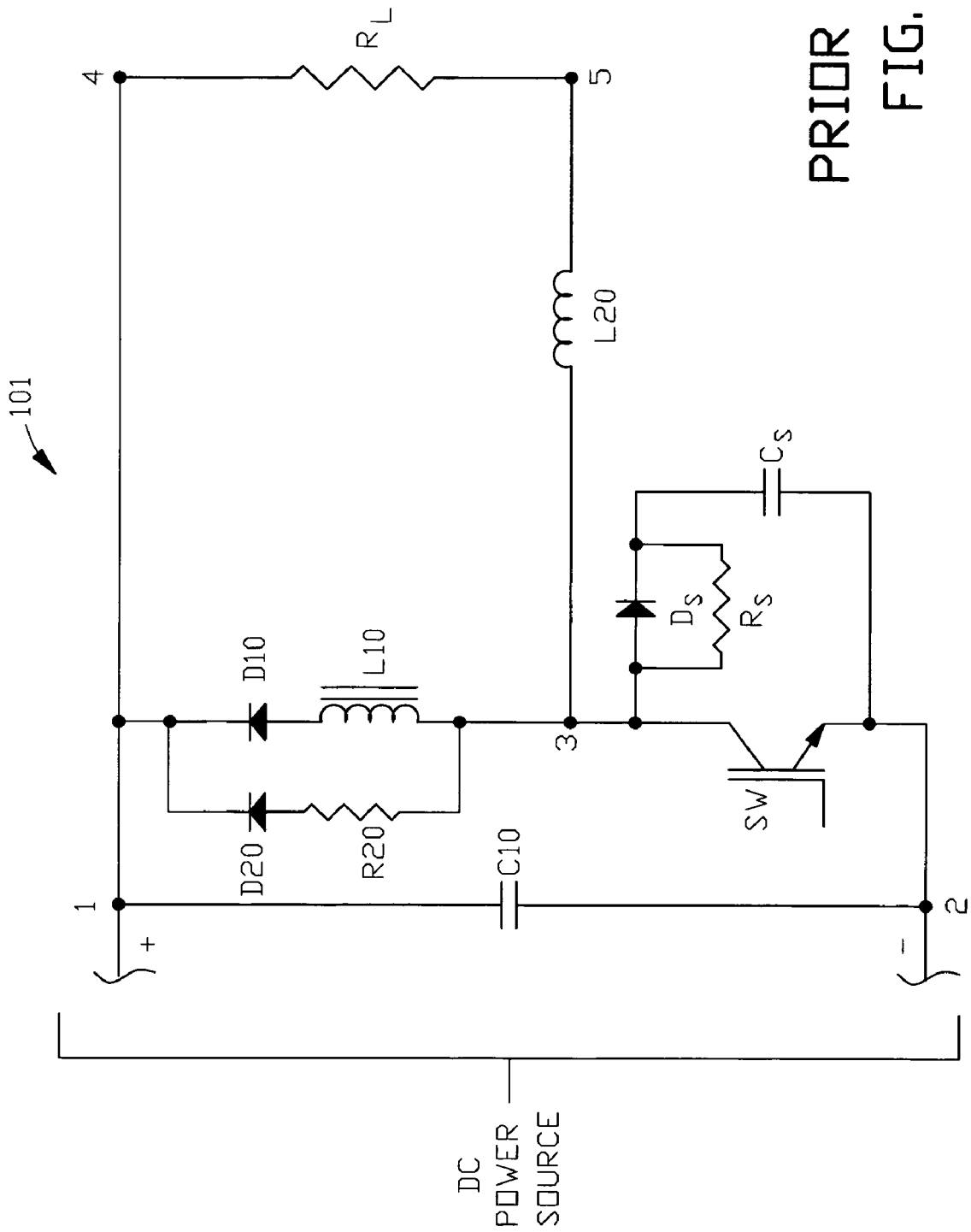
FIG. 1 is a schematic diagram of a prior art solid state switching circuit.

In the present invention, second diode D20 used in prior art FIG. 1 is not required to carry current until the diode in series with the primary winding starts to conduct due to the short ΔT time period for diode D1. As noted above, for the prior art circuit in FIG. 1, the ΔT time period for corresponding diode D1 is on the order of 8 to 10 µs.

Energy transferred from the primary to the secondary of transformer T1 will be stored as charge in capacitor C2 (referred to as transformer energy storage capacitor). When the next switch-on cycle begins at the next turn on of device SW (by conventional gating circuitry not shown in the figure), the circuit consisting of capacitor C2, inductor L1, diode D3 and capacitor C3 is properly biased from the previous switch-on cycle ($t_1$ to $t_4$ in FIG. 3) for stored charge (energy) to transfer from capacitor C2 to capacitor C3. Capacitor C2, inductor L1 (resonance inductor) and capacitor C3 form a resonant circuit and the voltage across capacitor C3 is negative at the start of the next switch-on cycle. Consequently the resonant circuit will resonant ("rings") to a positive voltage on C3 shortly after the turn on of device SW at time $t_3$ as shown in FIG. 3. Diode D3 blocks further ringing of the resonant circuit after the first half cycle which results in the transfer of stored energy from capacitor C2 (transformer energy storage capacitor) to capacitor C3 (transferred energy storage capacitor).

When the next switch-off cycle ($t_4$ to $t_7$ in FIG. 3) begins at turn-off of device SW, stored charge in capacitor C3 contributes to load $R_L$ current through diode D4. In this mode, capacitor C3 and diode D4 function as a snubber circuit and device SW is not simultaneously subjected to high voltage and high current during turn-off of device SW. The solid state switching circuit of the present invention provides recovery of the energy initially stored in the primary of transformer T1 (except for parasitic losses in the circuit components). With reduced losses in the switching device, the operating frequency of switching circuit can be beneficially increased, which, in turn, reduces costs of associated power components and the audible noise level of the circuit.

By way of example, and not limitation, components selected for one example of the solid states switching circuit of the present invention illustrated in FIG. 2 are as follows:

| Component | Source | Part No. |
| --- | --- | --- |
| Switching Device SW | Powerex, Inc. Youngwood, PA | CM600HU24F |
| Transformer T1 | Thermatool Corp., East Haven, CT | WP2146 |
| Diode D1 | Powerex, Inc. Youngwood, PA | QRF1230T36 |
| Diode D2 | Advanced Power Technology, Bend, OR | APT60D120B |

-continued

| Component | Source | Part No. |
|---|---|---|
| Diode D3 | Advanced Power Technology, Bend, OR | APT60D120B |
| Diode D4 | Advanced Power Technology, Bend, OR | APT60D120B |
| Capacitor C2 | Nissei-Arcotronics, Sasso Marconi, ITALY | C44CMUU4300AA1 |
| Capacitor C3 | Nissei-Arcotronics, Sasso Marconi, ITALY | C44CMUU3150AA1 |
| Inductor L1 | Thermatool Corp., East Haven, CT | WP5018-001 |
| Choke L2 | Marelco Power Systems, Inc., Howell, MI | M-22773 |

Comparison of a prior art application with the application of the solid state switching circuit of the present invention will further illustrate the advantages of the invention. Consider a conventional dc-to-dc buck chopper power supply as illustrated in FIG. 1 with an input voltage, $V_{in}$, (applied to terminals 1 and 2) of 600 volts dc, an output (load) voltage, $V_{out}$, (applied to terminals 1 and 5) ranging from 0 to 200 volts dc, an output (load) current, $I_{out}$, ranging from 0 to 1,000 amperes, and an operating frequency, f, of 10 kHz. A typical design requirement for the high-power, fast-recovery diode D10 is that the rate of change of current during reverse recovery should be held below 400 amperes/microsecond. Using a conventional series inductor switching circuit, with 600 volts dc input, a series inductor, L10, with a minimum inductance of 1.5 μH would be required, and design tolerances would typically dictate a conservative selection of a series inductor with an inductance, L, of 2.0 μH. In this application, the losses, $P_{(IND)loss}$, in the selected series inductor can be calculated from the equation:

$$P_{(IND)loss} = 0.5 \cdot L \cdot f \cdot [I_{out}]^2;\text{ substituting selected values,}$$

$$P_{(IND)loss} = 0.5 \cdot [2.0 \times 10^{-6}\ H] \cdot [10{,}000\ Hz] \cdot [1{,}000\ A]^2;$$
resulting in $$P_{(IND)loss} = 10{,}000\text{ watts.}$$

For this 200 kW ($V_{out} \cdot I_{out}$) output power supply, 10,000 watts represents a 5 percent loss in the switching circuit. For simplicity, losses from the reverse recovery current in the diode D4 are neglected in the calculation since they are typically under 1,000 Watts.

If a conventional snubber circuit shown in FIG. 1 is used to reduce switching losses at turn-off of the switching device with a typical design requirement of limiting the voltage rise across the switching device to less than the supply input voltage ($V_{in}$) in 1 μs, a minimum capacitance of 1.6 μF would be required for snubber capacitor $C_S$. Design tolerances would typically dictate a conservative selection of a snubber capacitor with a capacitance, Cs, of 2.0 μF. Further assuming a typical 250-volt overshoot, the peak voltage, $V_{cap}$, on the selected snubber capacitor would be 850 volts. In this application, maximum losses, $P_{(CAP)loss}$, in the selected snubber capacitor can be calculated from the equation:

$$P_{(CAP)loss} = 0.5 \cdot Cs \cdot [V_{cap}]^2 \cdot f;\text{ substituting selected values,}$$

$$P_{(CAP)loss} = 0.5 \cdot [2.0 \times 10^{-6}\ \mu F] \cdot \{[600\ V]^2 + [250\ V]^2\} \cdot [10$$

$$P_{(CAP)loss} = 4{,}225\text{ watts.}$$

Further losses are incurred when shortly after device SW turns off, capacitor Cs discharges from 850 to 600 volts through resistor Rs, and when device SW turns on, capacitor Cs discharges from 600 Volts to 0 Volts through resistor Rs.

Consequently the comparative prior art application results in a total loss of 14,225 watts ($P_{(IND)loss} + P_{(CAP)loss}$), which is approximately 7.5 percent of the 200-kW output power supply. Typically one would reduce this high level of losses by reducing the operating frequency, f, to 2 or 3 kHz.

For an application with a buck chopper power supply having equivalent output parameters as the above prior art power supply, and using the solid state switching circuit of the present invention, the selected inductance of the series transformer T1 would be 2.0 μH, the leakage inductance of T1 would be less then 0.1 μH, and the selected capacitance of snubber capacitor C3 would be 4.0 μF. In this case, total switching circuit losses can be calculated to be less than 300 watts.

The examples of the invention include reference to specific electrical components. One skilled in the art may practice the invention by substituting components that are not necessarily of the same type but will create the desired conditions or accomplish the desired results of the invention. For example, single components may be substituted for multiple components or vice versa.

Further although a step down switch mode power supply is used to illustrate the invention, the switching circuit of the present invention has applications in other circuit topologies.

The foregoing examples do not limit the scope of the disclosed invention. The scope of the disclosed invention is further set forth in the appended claims.

The invention claimed is:
1. A switching circuit comprising:
 a dc power source;
 a switching device having a first and a second switching device terminals;
 a transformer having a first and a second primary winding terminals, and a first and a second secondary winding terminals, the second primary winding terminal connected to the second switching device terminal;
 a freewheeling diode have a first and a second freewheeling diode terminals, the second freewheeling diode terminal connected to the first primary winding terminal, the series combination of the switching device, the primary winding of the transformer and the freewheeling diode connected across the output of the dc power source;
 a load impedance;
 a choke connected in series with the load impedance, the series combination of the load impedance and the choke connected across the series combination of the freewheeling diode and the primary winding of the transformer;
 a first diode;
 a transferred energy storage capacitor, the transferred energy storage having a common connection with the anode of the first diode, the series combination of the first diode and transferred energy storage capacitor connected in parallel with the series combination of the load impedance and choke;
 a second diode;
 a transformer energy storage capacitor; the transfer energy storage capacitor having a common connection with the cathode of the second diode, the series combination of the winding transfer energy storage capacitor and second diode connected across the first and the second secondary winding terminals, the anode of the second diode connected to the second secondary winding terminal;

a third diode; and a resonance inductor, the resonance inductor connected to the anode of the third diode, the series combination of the resonance inductor and the third diode connected between the common connection of the series combination of the first diode and transferred energy storage capacitor and the common connection of the series combination of the second diode and transformer energy storage capacitor.

2. The switching circuit of claim 1 wherein the switching device comprises an insulated gate bipolar transistor.

3. The switching circuit of claim 1 wherein the load impedance is substantially resistive.

4. A method of solid state circuit switching comprising the steps of:

connecting a series combination of a switching device, the primary of a transformer and a freewheeling diode across the output of a dc power source;

connecting a series combination of a load impedance and a choke across the series combination of the primary of the transformer and the freewheeling diode so that when the switching device is not turned on, a first current flows in the circuit path formed by the load impedance, the choke, the primary of the transformer and the freewheeling diode;

turning on the switching device so that the first current decreases while a second current through the switching device increases until the freewheeling diode is not conducting;

connecting a series combination of a transferred energy storage capacitor and a first diode across the series combination of the load impedance and the choke so that when the switching device is initially turned off, a third current increases in the circuit path formed by the load impedance, the choke, the transferred energy storage capacitor and the first diode until the voltage across the switching device increases to a level at which a fourth current begins to flow in the secondary of the transformer;

connecting the secondary of the transformer to a series combination of a second diode and a transformer energy storage capacitor to drive the freewheeling diode to a conducting state so that the first current flows in the circuit path formed by the load impedance, the choke, the primary of the transformer and the freewheeling diode; and connecting a series combination of a resonance inductor and a third diode between the common connection of the series combination of the second diode and the transformer energy storage capacitor, and the common connection of the series combination of the transferred energy storage capacitor and the first diode so that when the switching device is initially turned on, stored charge is transferred from the transformer energy storage capacitor to the transferred energy storage capacitor.

* * * * *

UNITED STATES PATENT AND TRADEMARK OFFICE
CERTIFICATE OF CORRECTION

| | | |
|---|---|---|
| PATENT NO. | : 7,184,279 B2 | Page 1 of 1 |
| APPLICATION NO. | : 11/097525 | |
| DATED | : February 27, 2007 | |
| INVENTOR(S) | : Thomas G. Lee | |

It is certified that error appears in the above-identified patent and that said Letters Patent is hereby corrected as shown below:

Column 5, line 62: "[10" should read --[10,000 Hz]; resulting in--

Signed and Sealed this

First Day of May, 2007

JON W. DUDAS
*Director of the United States Patent and Trademark Office*